United States Patent
Nakamura et al.

(10) Patent No.: US 8,072,293 B2
(45) Date of Patent: Dec. 6, 2011

(54) SURFACE ACOUSTIC WAVE FILTER, ANTENNA DUPLEXER AND METHOD FOR MANUFACTURING THEM

(75) Inventors: Hiroyuki Nakamura, Osaka (JP); Ken Matsunami, Osaka (JP); Tetsuya Tsurunari, Osaka (JP); Hidekazu Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 319 days.

(21) Appl. No.: 12/444,617

(22) PCT Filed: Nov. 12, 2007

(86) PCT No.: PCT/JP2007/071890
§ 371 (c)(1),
(2), (4) Date: Apr. 7, 2009

(87) PCT Pub. No.: WO2008/059780
PCT Pub. Date: May 22, 2008

(65) Prior Publication Data
US 2010/0097161 A1    Apr. 22, 2010

(30) Foreign Application Priority Data
Nov. 17, 2006 (JP) .................. 2006-311174

(51) Int. Cl.
H03H 9/64  (2006.01)
H03H 9/72  (2006.01)

(52) U.S. Cl. .............. 333/133; 333/193; 333/195
(58) Field of Classification Search .......... 333/193–196, 333/133; 310/313 B
See application file for complete search history.

(56) References Cited

U.S. PATENT DOCUMENTS

| | | | |
|---|---|---|---|
| 6,501,208 B1 * | 12/2002 | Kuroda | 310/313 R |
| 6,570,470 B2 * | 5/2003 | Maehara et al. | 333/193 |
| 6,717,487 B2 | 4/2004 | Takata | |
| 6,833,774 B2 * | 12/2004 | Abbott et al. | 333/193 |
| 6,903,626 B2 | 6/2005 | Tsutsumi et al. | |
| 6,903,630 B2 | 6/2005 | Miura et al. | |
| 7,209,018 B2 | 4/2007 | Nakao et al. | |
| 7,310,027 B2 | 12/2007 | Kando | |

(Continued)

FOREIGN PATENT DOCUMENTS

| | | |
|---|---|---|
| JP | 10-084245 | 3/1998 |
| JP | 11-220354 | 8/1999 |
| JP | 2002-217679 | 8/2002 |

(Continued)

OTHER PUBLICATIONS

International Search Report issued Jan. 8, 2008 in the International (PCT) Application of which the present application is the U.S. National Stage.

*Primary Examiner* — Barbara Summons
(74) *Attorney, Agent, or Firm* — Wenderoth, Lind & Ponack, L.L.P.

(57) ABSTRACT

A surface acoustic wave filter comprised of a plurality of surface acoustic wave resonators having different resonance frequencies, the filter comprising a substrate made of lithium niobate, comb electrodes (1201 and 1202) formed on the substrate, and a thin dielectric film covering the comb electrodes (1201 and 1202), wherein the surface acoustic wave resonator having a lower resonance frequency is formed to have a metallization ratio larger than a metallization ratio of the surface acoustic wave resonator having a higher resonance frequency, thereby providing the surface acoustic wave filter and an antenna duplexer featuring superior characteristics with insignificant ripples while suppressing spurious responses of the surface acoustic wave resonators.

7 Claims, 14 Drawing Sheets

U.S. PATENT DOCUMENTS

| | | | |
|---|---|---|---|
| 7,345,400 B2 * | 3/2008 | Nakao et al. | 310/313 A |
| 7,486,158 B2 * | 2/2009 | Takata | 333/133 |
| 7,538,636 B2 | 5/2009 | Takayama et al. | |
| 7,812,688 B2 * | 10/2010 | Nakamura et al. | 333/133 |
| 2002/0093399 A1 | 7/2002 | Takata | |
| 2002/0140316 A1 | 10/2002 | Yamanouchi | |
| 2003/0117039 A1 | 6/2003 | Tsutsumi et al. | |
| 2003/0214372 A1 | 11/2003 | Miura et al. | |
| 2006/0186968 A1 * | 8/2006 | Ito | 333/133 |
| 2009/0115287 A1 | 5/2009 | Kando | |

FOREIGN PATENT DOCUMENTS

| | | | |
|---|---|---|---|
| JP | 2003-188681 | | 7/2003 |
| JP | 2003-209458 | | 7/2003 |
| JP | 2003-332880 | | 11/2003 |
| JP | 2003-332881 | * | 11/2003 |
| JP | 2004-222267 | | 8/2004 |
| JP | 2004-254291 | | 9/2004 |
| WO | 2005/099091 | | 10/2005 |
| WO | WO 2006/067935 | * | 6/2006 |
| WO | 2006/114930 | | 11/2006 |

* cited by examiner

FIG. 15A - PRIOR ART
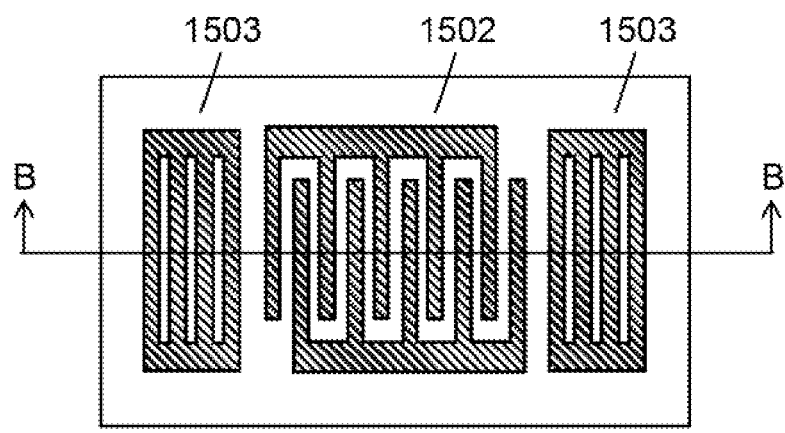
FIG. 15B - PRIOR ART
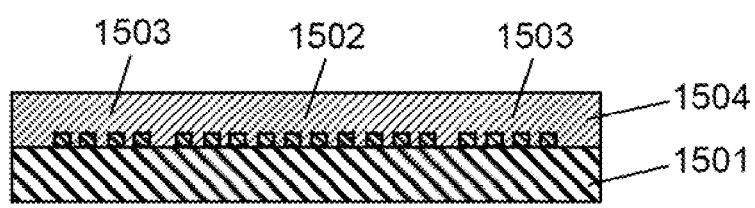

FIG. 16A - PRIOR ART
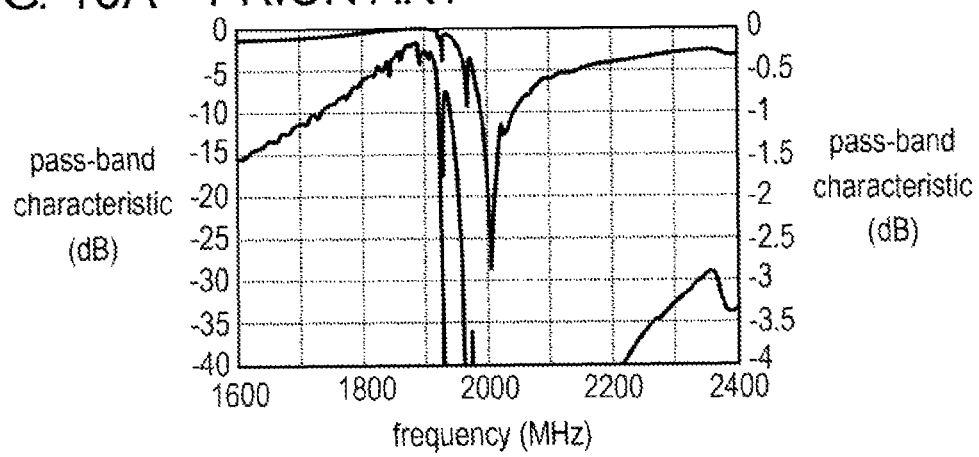
FIG. 16B - PRIOR ART
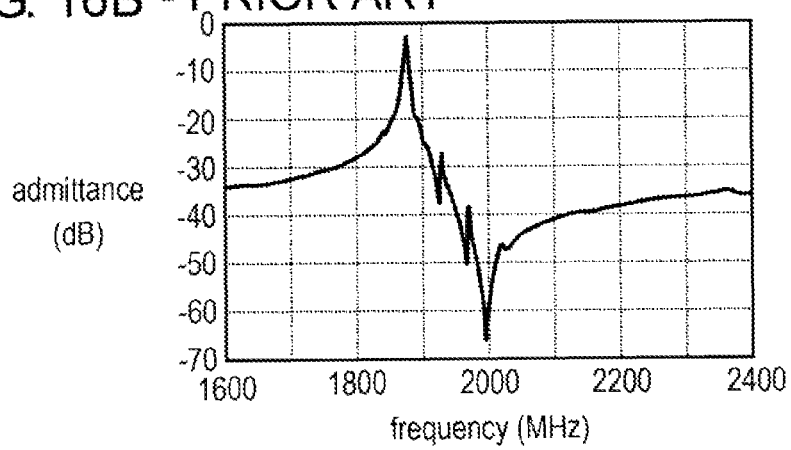
FIG. 17 - PRIOR ART
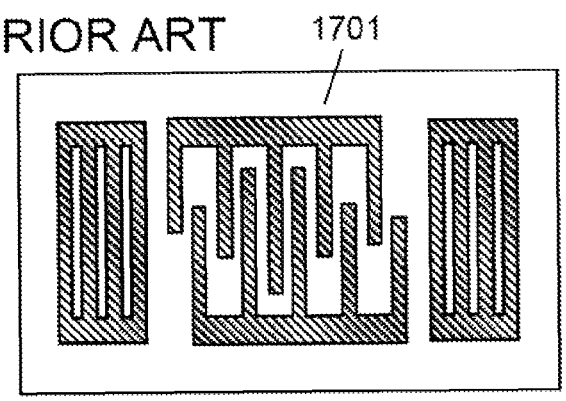

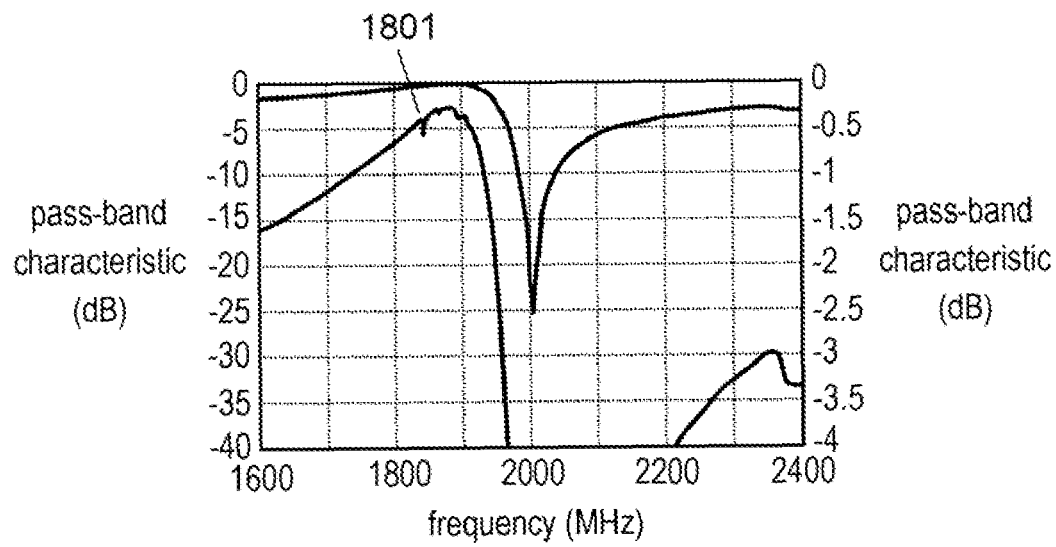
FIG. 18A - PRIOR ART
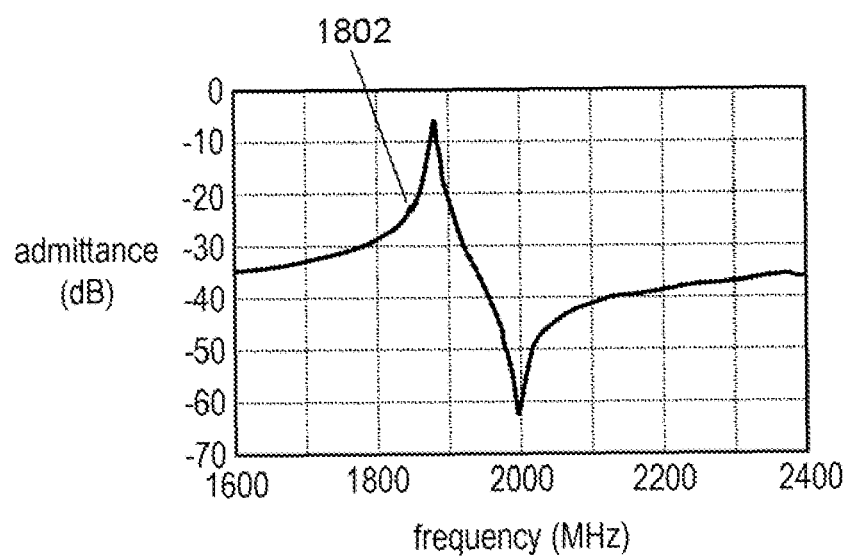
FIG. 18B - PRIOR ART

SURFACE ACOUSTIC WAVE FILTER, ANTENNA DUPLEXER AND METHOD FOR MANUFACTURING THEM

TECHNICAL FIELD

The present invention relates to surface acoustic wave filters, antenna duplexers, and a method for manufacturing them.

BACKGROUND ART

It has been the general practice to use piezoelectric substrates having large electromechanical coupling coefficients, such as lithium niobate ($LiNbO_3$) substrates, in order to produce surface acoustic wave filters featuring wideband characteristics.

However, the surface acoustic wave filters using substrates of such kind have a drawback in general that they are poor in temperature characteristic.

To this end, patent document 1 discloses a structure contrived to improve the temperature characteristic.

The structure disclosed in the patent document 1 comprises a $LiNbO_3$ substrate and a thin layer of $SiO_2$ film formed on the substrate, wherein the $LiNbO_3$ substrate is a rotated Y-cut substrate having a cut angle set to a range of −10 to +30 degrees, and further wherein, when a film thickness of the thin layer and a wavelength of a center operating frequency of the surface acoustic wave are denoted by H and λ respectively, a value of H/λ is set to a range of 0.115 to 0.31.

Surface acoustic wave resonators formed on such a substrate are then coupled into a ladder configuration to complete a surface acoustic wave filter having a wide-band characteristic.

FIG. 15A is a schematic view of a conventional surface acoustic wave resonator, and FIG. 15B is a sectional view taken along the line A-A.

As shown in FIGS. 15A and 15B, the conventional surface acoustic wave resonator has a structure, in which comb electrodes 1502 and reflector electrodes 1503 are formed on piezoelectric substrate 1501, and a thin $SiO_2$ film 1504 is formed over them.

The surface acoustic wave resonator constructed as above has characteristic curves shown in FIGS. 16A and 16B. FIG. 16A shows a pass-band characteristic and FIG. 16B shows admittance (Y11). In this instance here, the piezoelectric substrate is a rotated Y-cut substrate of $LiNbO_3$ having a cut angle of 5 degrees, and the electrodes and the thin $SiO_2$ film have thicknesses of values standardized according to a wavelength, which are 8% and 20% respectively. The electrodes are composed of a material containing aluminum as a principal component. There appear a plurality of spurious responses in the surface acoustic wave resonator as shown in these figures.

There are cases that spurious responses occur due to resonances in the transverse mode when this type of substrate is used. A method generally employed to suppress the spurious responses is to assign weights on the comb electrodes.

FIG. 17 shows a schematic view of a surface acoustic wave resonator having comb electrodes weighted by apodization for suppression of the spurious responses.

As shown in FIG. 17, comb electrodes 1701 have a shape weighted by apodization in a manner that their interdigitating lengths decrease from the center toward both sides thereof.

Characteristic curves of this surface acoustic wave resonator are shown in FIGS. 18A and 18B. FIG. 18A shows a pass-band characteristic and FIG. 18B shows admittance.

It is apparent in the characteristics of the surface acoustic wave resonator shown in FIGS. 18A and 18B that the spurious responses attributed to resonances in the transverse mode are suppressed as compared to those of FIGS. 16A and 16B.

In this type of surface acoustic wave resonator, however, there occur insuppressible spurious responses on the lower side of a resonance frequency that are considered to be attributable to the Rayleigh mode propagation, although the spurious responses by the resonances in the transverse mode are suppressed.

Levels of spurious response 1801 in the pass-band characteristic and spurious response 1802 in the admittance are as large in values as 0.2 dB and 1.0 dB respectively, as shown in FIGS. 18A and 18B. These types of conventional surface acoustic wave resonators thus have a drawback that ripples present within the frequency band adversely affect the characteristics when they are used for a ladder type filter or an antenna duplexer.

[Patent Document 1] Japanese Patent Unexamined Publication, No. 2003-209458

SUMMARY OF THE INVENTION

The present invention is intended to solve the above problems of the conventional art, and to provide a surface acoustic wave filter and an antenna duplexer featuring superior characteristics with insignificant ripples while suppressing spurious responses of surface acoustic wave resonators. The present invention also provides a method of manufacturing such surface acoustic wave filter and antenna duplexer.

The surface acoustic wave filter of the present invention is provided with a plurality of surface acoustic wave resonators having different resonance frequencies, wherein the filter comprises a substrate made of lithium niobate, a comb electrode formed on an upper surface of the substrate, and a thin dielectric film covering the comb electrodes, and further wherein a metallization ratio of the surface acoustic wave resonator having a lower resonance frequency is larger than a metallization ratio of the surface acoustic wave resonator having a higher resonance frequency.

It becomes possible according to this structure to achieve the surface acoustic wave filter of superior characteristics with insignificant ripples while suppressing spurious responses.

Antenna duplexer of the present invention constitute an antenna duplexer having a receiving filter and a sending filter, each comprised of a surface acoustic wave filter provided with a plurality of surface acoustic wave resonators having different resonance frequencies, wherein each of the resonators comprises a substrate made of lithium niobate, a comb electrode formed on an upper surface of the substrate and a thin dielectric film covering the comb electrode, and further wherein a metallization ratio of the surface acoustic wave resonator having a lower resonance frequency is larger than a metallization ratio of the surface acoustic wave resonator having a higher resonance frequency.

It also becomes possible according to this structure to achieve the antenna duplexer of superior characteristics with insignificant ripples while suppressing spurious responses.

BRIEF DESCRIPTION OF DRAWINGS

FIG. 15A is a schematic view of a conventional surface acoustic wave resonator;

FIG. 15B is another schematic view of the conventional surface acoustic wave resonator;

FIG. 16A is a characteristic chart of the conventional surface acoustic wave resonator;

FIG. 16B is another characteristic chart of the conventional surface acoustic wave resonator;

FIG. 17 is a schematic view of a conventional surface acoustic wave resonator weighted by apodization;

FIG. 18A is a characteristic chart of the conventional surface acoustic wave resonator weighted by apodization; and FIG. 18B is another characteristic chart of the conventional surface acoustic wave resonator weighted by apodization.

DETAILED DESCRIPTION OF PREFERRED EMBODIMENTS

Referring now to the accompanying drawings, description is provided hereinafter of a surface acoustic wave filter and an antenna duplexer according to an exemplary embodiment of the present invention.

Exemplary Embodiment

First, a study was made on shapes of $SiO_2$ films used as thin dielectric films, and evaluations performed on characteristics of surface acoustic wave resonators.

Figure 1A:
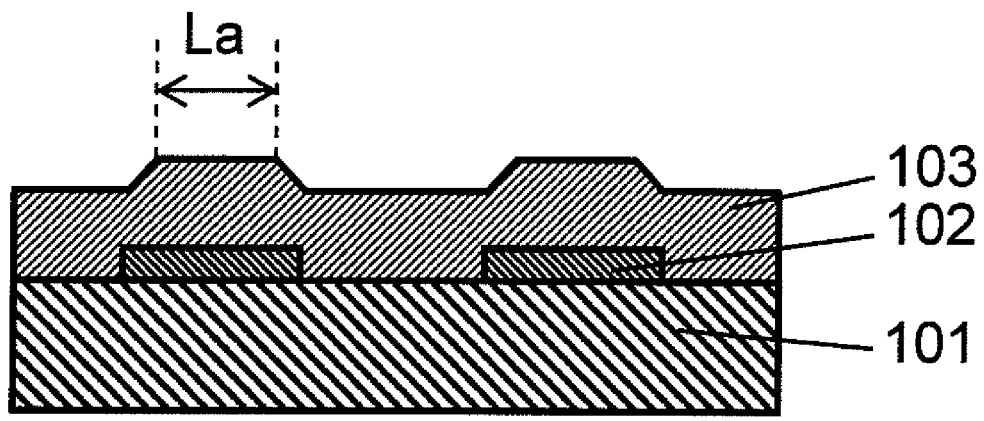
FIG. 1A is a schematic view of a thin $SiO_2$ film.
Figure 1B:
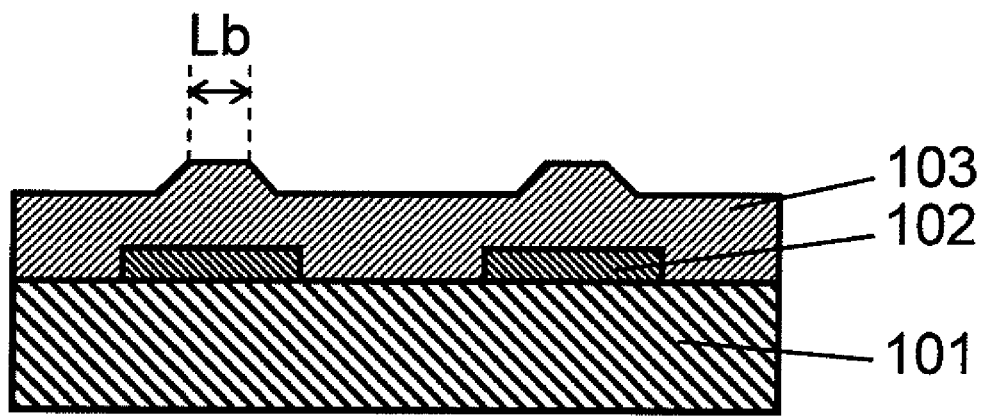
FIG. 1B is a schematic view of another thin $SiO_2$ film.

FIGS. 1A and 1B are schematic views of thin $SiO_2$ films 103 formed on electrodes 102 on piezoelectric substrates 101 used as substrates. FIG. 1A shows the thin $SiO_2$ film provided with raised portions above the electrodes, upper parts of the raised portions having large length La, and FIG. 1B shows the thin $SiO_2$ film provided with raised portions above the electrodes, upper parts of the raised portions having small length Lb, wherein they have a relation of La>Lb. Any such shapes can be achieved by applying a bias voltage to the substrate, for instance, when $SiO_2$ is being deposited. The shape of the thin $SiO_2$ film can be controlled from the one in FIG. 1A to another in FIG. 1B by increasing the bias voltage.

Figure 2A:
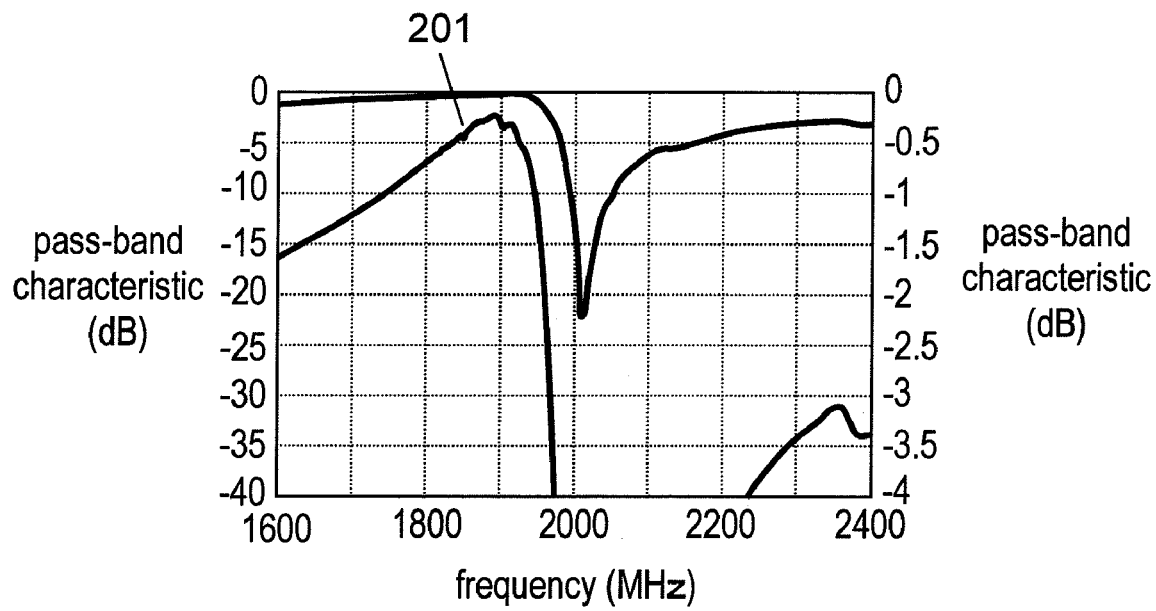
FIG. 2A is a characteristic chart of a surface acoustic wave resonator.
Figure 2B:
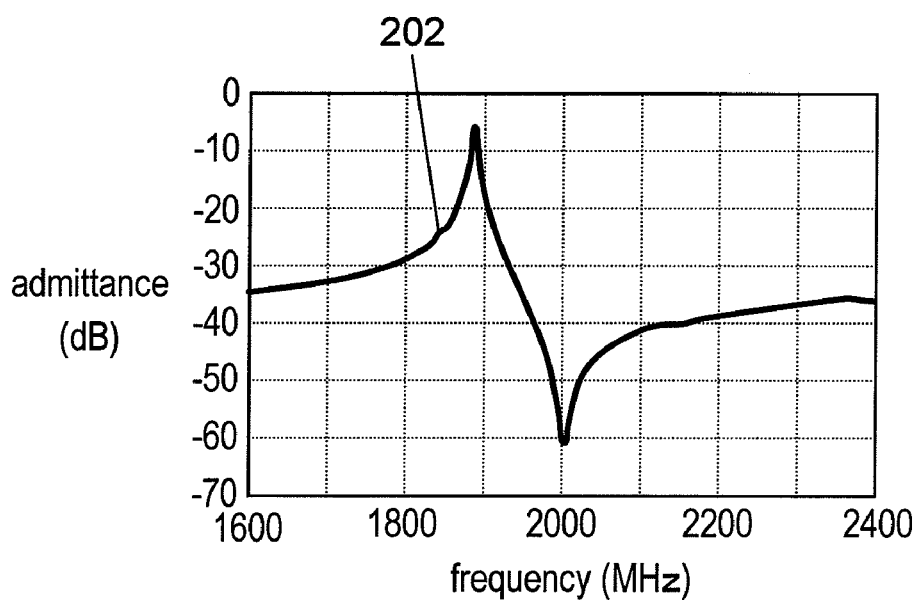
FIG. 2B is another characteristic chart of the surface acoustic wave resonator.

FIGS. 2A and 2B are graphs representing characteristics of a surface acoustic wave resonator having a thin $SiO_2$ film formed by using an increased bias voltage during the process of manufacturing the surface acoustic wave resonator of the same structure as the conventional one shown in FIG. 17.

The thin $SiO_2$ film of the surface acoustic wave resonator manufactured in the above manner becomes such a shape that the raised portions above the electrodes are reduced in length across their upper parts as compared to the shape shown in FIG. 17.

FIG. 2A shows a pass-band characteristic and FIG. 2B shows admittance. As shown in FIGS. 2A and 2B, spurious response 201 in the pass-band characteristic and spurious response 202 in the admittance are suppressed to 0.05 dB and 0.1 dB respectively.

Figure 3:
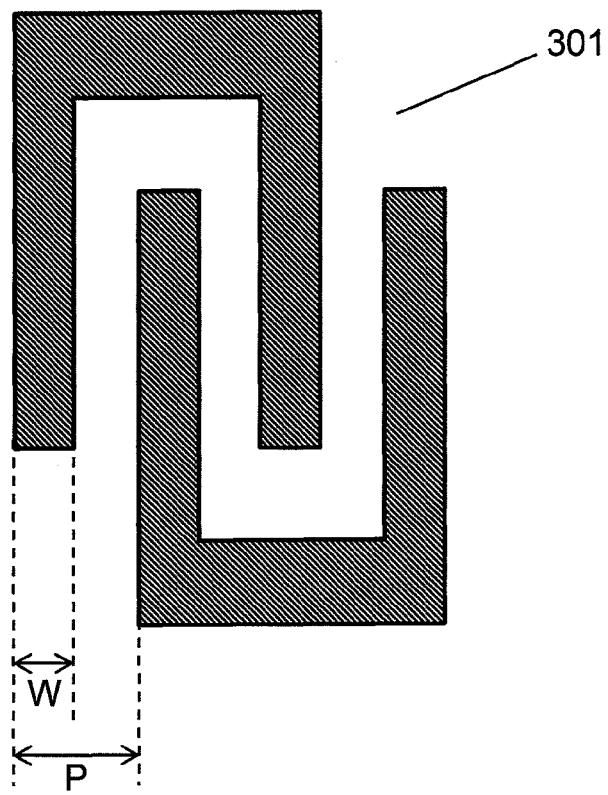
FIG. 3 is an illustrative diagram showing a metallization ratio of a comb electrode.

The spurious responses can be suppressed in this manner by controlling the depositing condition of forming the thin $SiO_2$ film. However, this method causes degradation in the characteristics of the resonator to some extent. This is especially evident in the characteristics that a Q-factor at the anti-resonance point decreases from 180 to 120 and a level of the attenuation pole also decreases from 24.5 dB to 22.0 dB. These effects lead to an aggravation of loss in the pass-band characteristic when it is used as a parallel arm resonator of ladder type filter. Evaluations were performed next on characteristics of the resonators relative to metallization ratios of the comb electrodes. Here, FIG. 3 is a schematic view showing comb electrodes 301, wherein metallization ratio ($\eta$) is expressed by $\eta=W/P$ when a pitch and an electrode width of comb electrodes 301 are denoted by P and W respectively as shown in FIG. 3. The same condition was used for depositing $SiO_2$.

Figure 4:
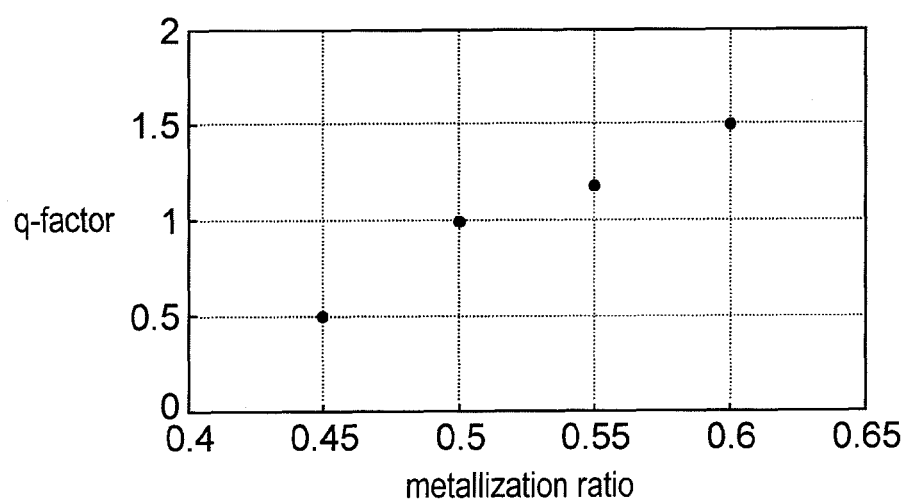
FIG. 4 is a graphic chart showing a relation between Q-factors and metallization ratios.

FIG. 4 shows a relation of Q-factor at the anti-resonance point with respect to metallization ratio ($\eta$). The axis of ordinates is standardized by the Q-factor corresponding to $\eta=0.50$. It is noted from FIG. 4 that the Q-factor improves as the metallization ratio ($\eta$) increases.

Figure 5A:
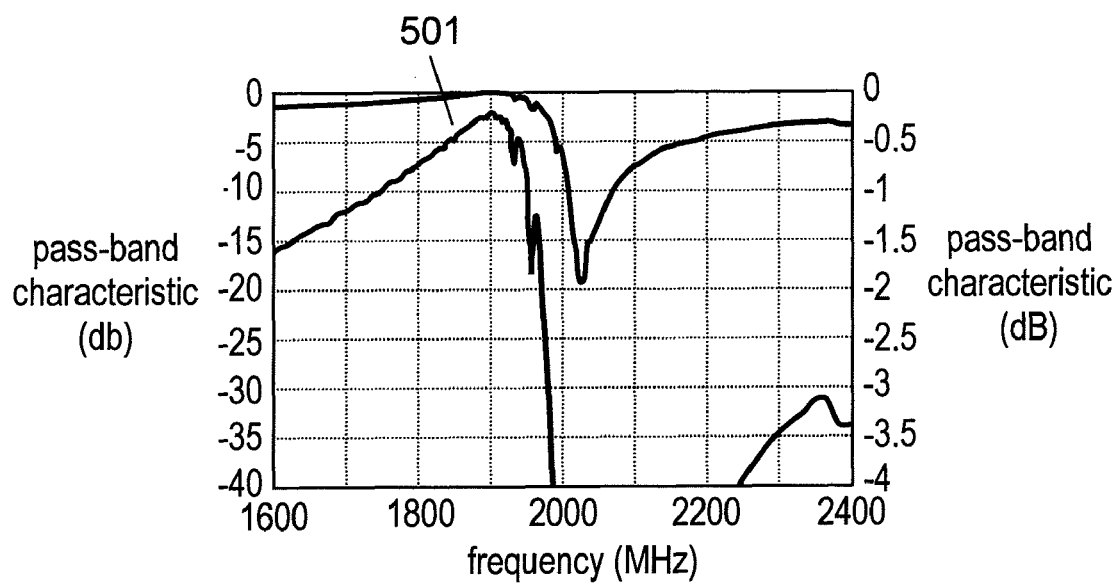
FIG. 5A is a characteristic chart of a surface acoustic wave resonator having $\eta=0.45$.
Figure 5B:
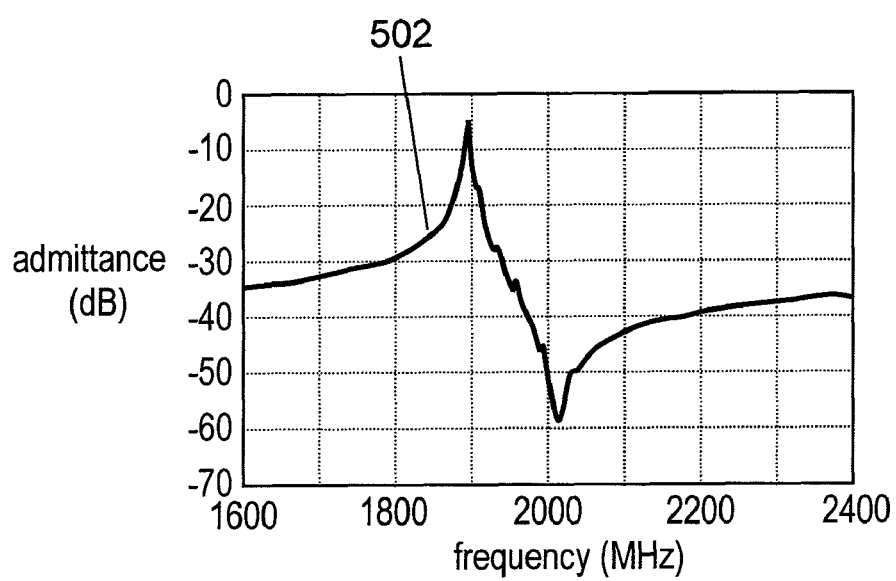
FIG. 5B is another characteristic chart of the surface acoustic wave resonator having $\eta=0.45$.

FIG. 5A through FIG. 7B show various characteristics of surface acoustic wave resonators. Among these figures, FIGS. 5A and 5B represent the characteristics of a sample having $\eta=0.45$, FIGS. 6A and 6B the characteristics of another sample having $\eta=0.50$, FIGS. 7A and 7B the characteristics of another sample having $\eta=0.55$, and the figures with suffix A and suffix B show pass-band characteristics and admittances respectively.

In these samples here, pitches are set to P=1.00 μm, the piezoelectric substrates are rotated Y-cut substrates of $LiNbO_3$ having a cut angle of 5 degrees, and the electrodes and the thin $SiO_2$ films have thicknesses of values standardized according to a wavelength, which are 8% and 20% respectively. The electrodes are formed of a material containing aluminum as a principal component.

It is apparent in these figures that spurious responses 501, 502, 601, 602, 701 and 702 on the lower side of the resonance frequency increase in their levels with increase of the metallization ratio (η), although spurious responses on the higher side of the resonance frequency are suppressed because of the weights assigned by apodization as they are attributed to transverse mode resonances as discussed above.

Figure 8A:
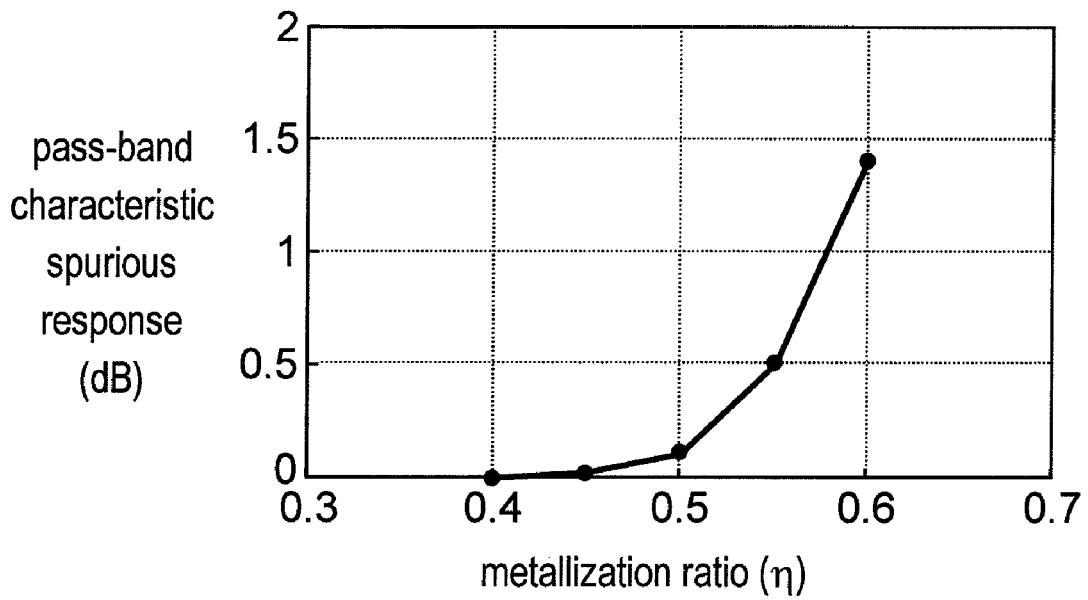
FIG. 8A is a graphic chart showing a relation between spurious responses and metallization ratios.
Figure 8B:
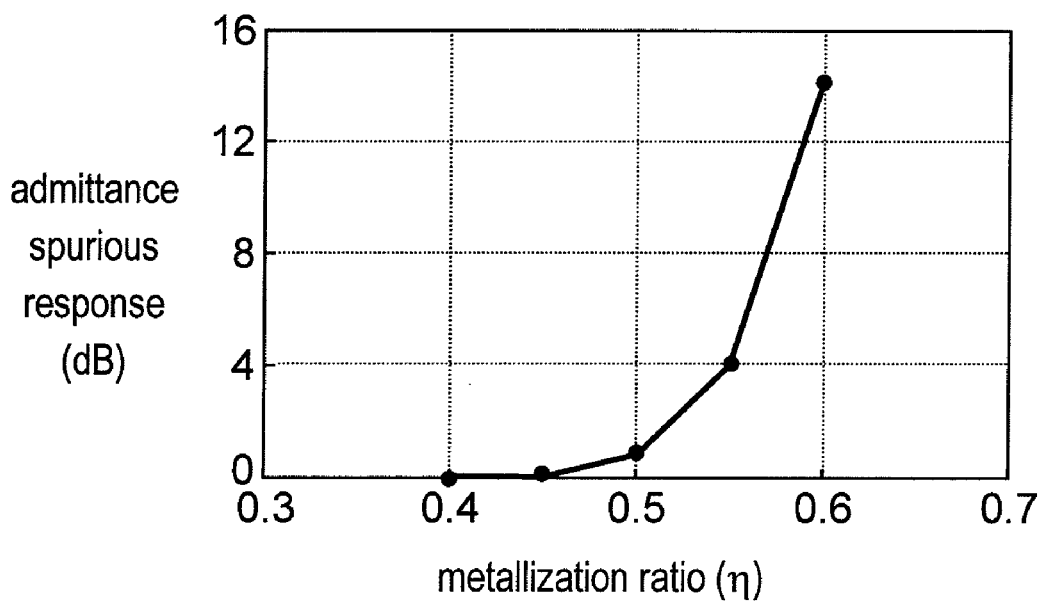
FIG. 8B is a graphic chart showing another relation between spurious responses and metallization ratios.

FIG. 8A shows a relation between spurious response in the pass-band characteristic and metallization ratio, and FIG. 8B shows a relation between spurious response in admittance and the metallization ratio.

The spurious response increases as the metallization ratio (η) is increased, as shown in these figures. It thus becomes clear that an increase in the metallization ratio raises the spurious response though it can improve the Q-factor and a level of the attenuation pole. In other words, the bias voltage may be reduced, as one factor of the depositing conditions of forming the thin $SiO_2$ film for improvement of the characteristics, if the metallization ratio (η) can be kept small.

Figure 6A:
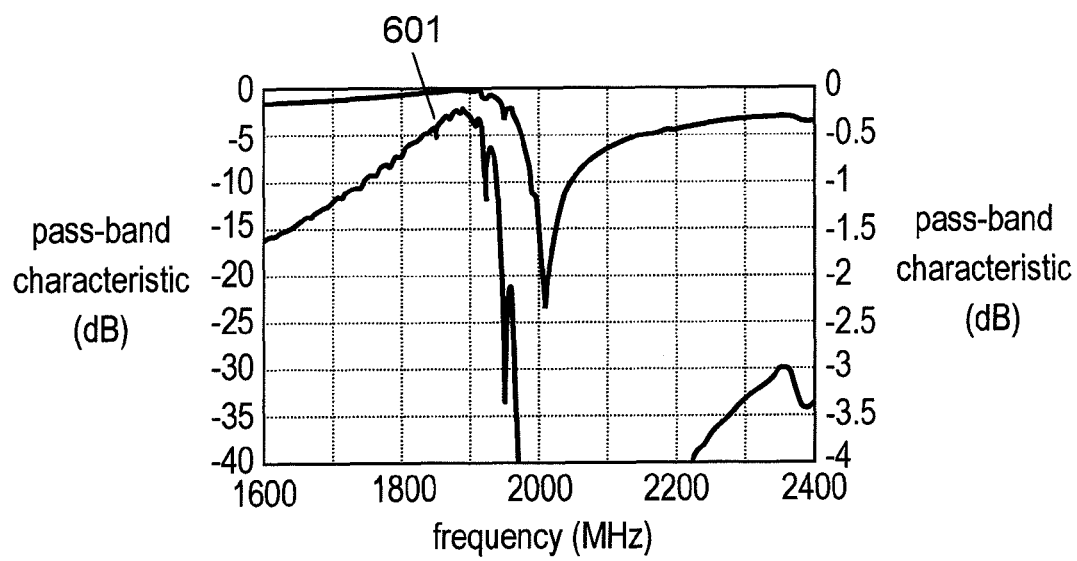
FIG. 6A is a characteristic chart of another surface acoustic wave resonator having $\eta=0.50$.
Figure 6B:
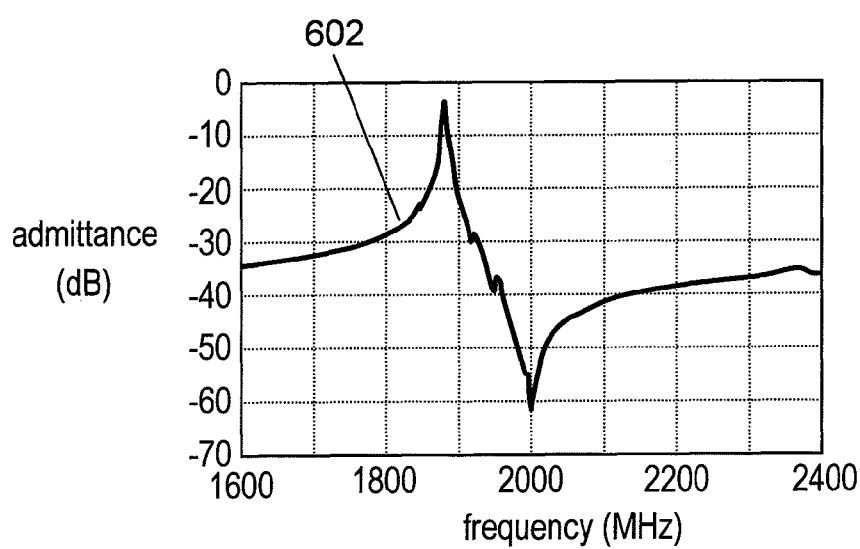
FIG. 6B is another characteristic chart of the surface acoustic wave resonator having $\eta=0.50$.
Figure 7A:
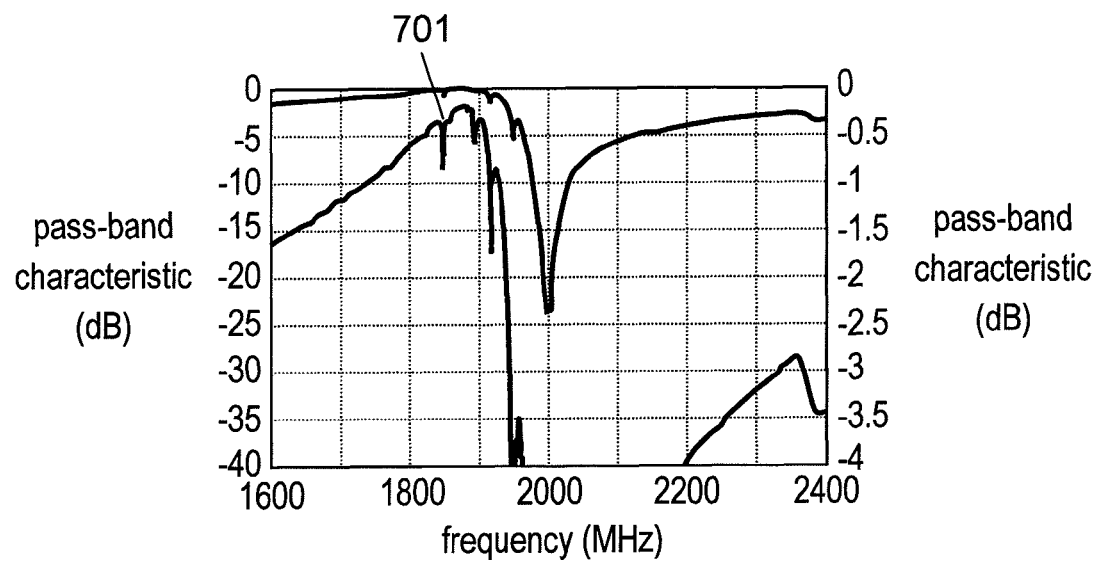
FIG. 7A is a characteristic chart of still another surface acoustic wave resonator having $\eta=0.55$.
Figure 7B:
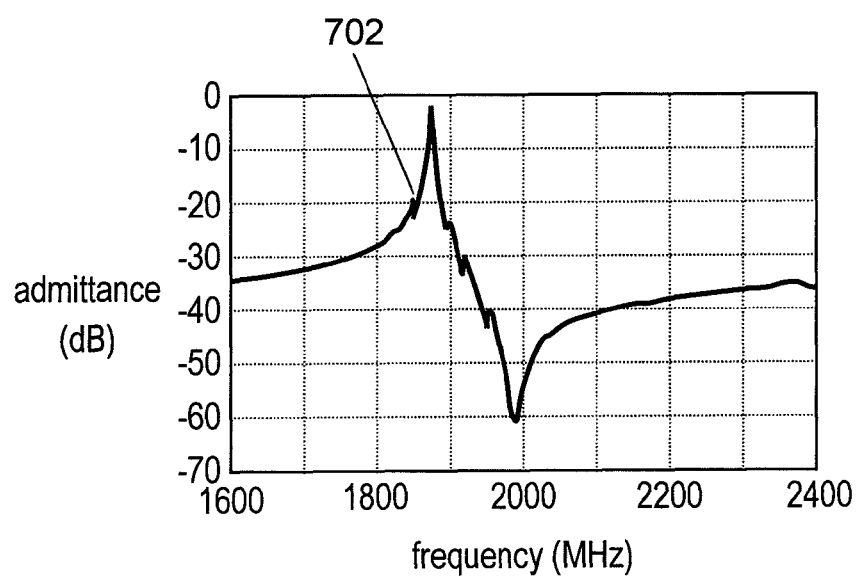
FIG. 7B is another characteristic chart of the surface acoustic wave resonator having $\eta=0.55$.
Figure 9A:
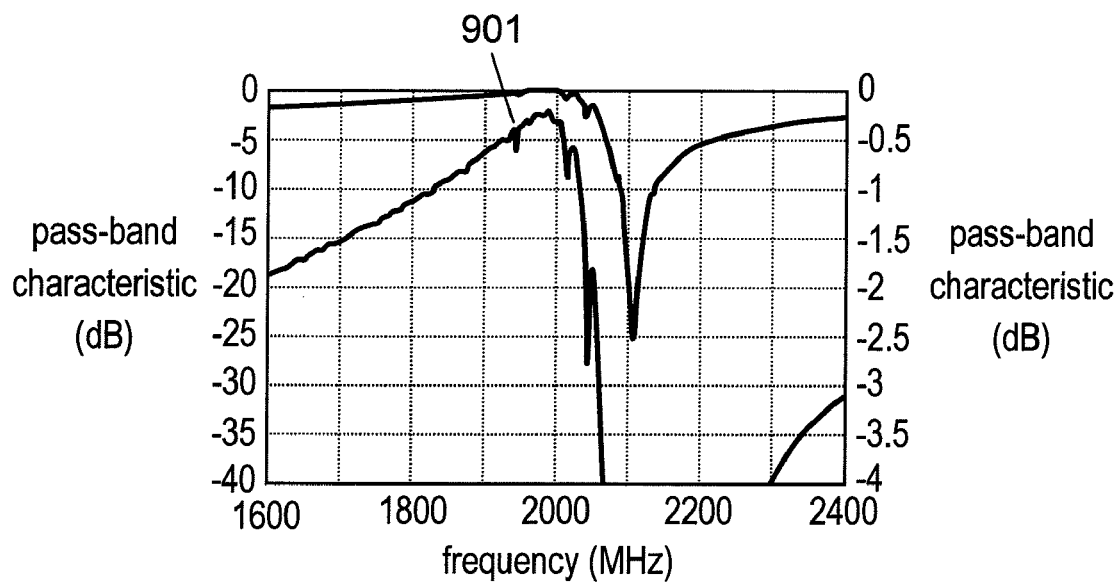
FIG. 9A is a characteristic chart of a surface acoustic wave resonator having P=0.95.
Figure 9B:
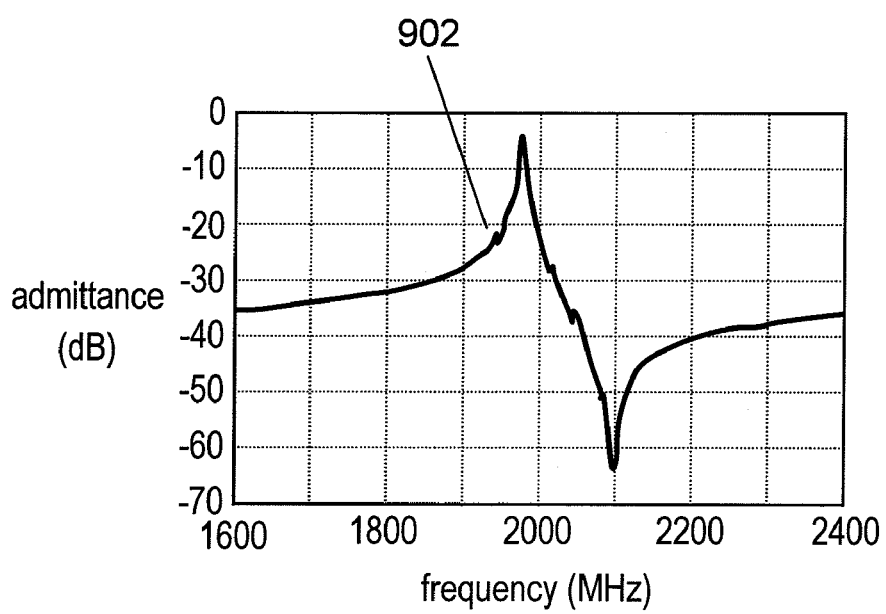
FIG. 9B is another characteristic chart of the surface acoustic wave resonator having P=0.95.
Figure 10A:
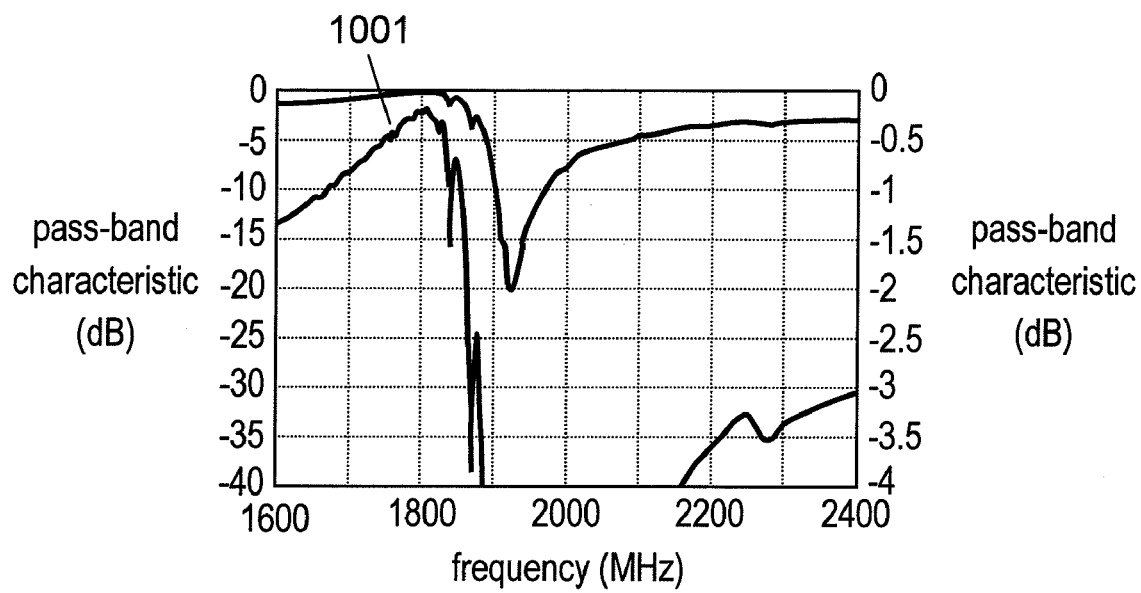
FIG. 10A is a characteristic chart of another surface acoustic wave resonator having P=1.05.
Figure 10B:
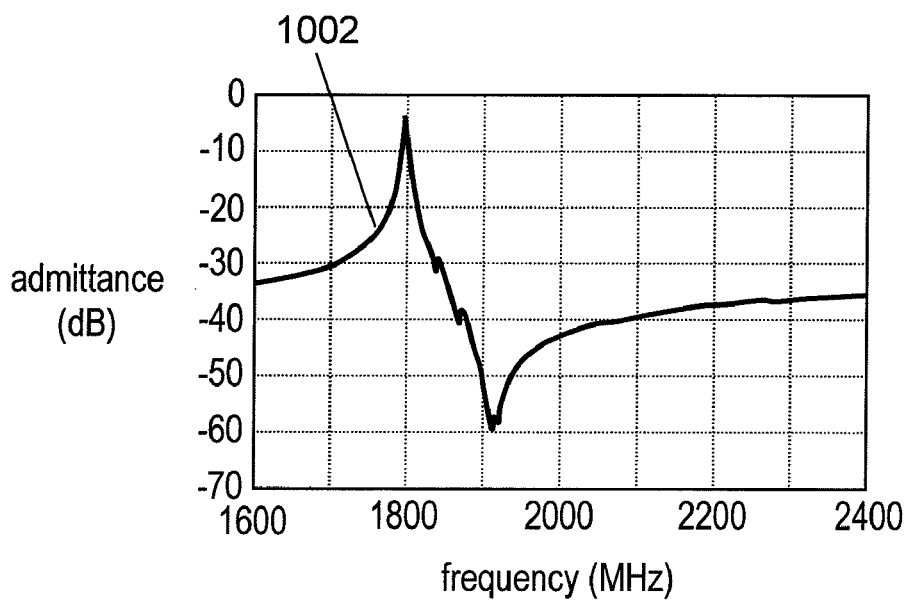
FIG. 10B is another characteristic chart of the surface acoustic wave resonator having P=1.05.

Evaluations were then performed on characteristics of the resonators relative to pitches of the comb electrodes. The pitches in this context mean spaces provided between the comb electrodes, and are denoted by P shown in FIG. 3. FIG. 9A through FIG. 10B show various characteristics of the surface acoustic wave resonators. Among these figures, FIGS. 9A and 9B represent the characteristics of a sample having P=0.95, FIGS. 10A and 10B represent the characteristics of another sample having P=1.05, and the figures with suffix A and suffix B show pass-band characteristics and admittances respectively. Incidentally, the characteristics shown in FIGS. 6A and 6B are those of the surface acoustic wave resonator having metallization ratio (η) of 0.50 and pitches P of 1.00.

It is known from these figures that spurious responses 901, 902, 1001 and 1002 on the lower side of the resonance frequency increase in their levels with decrease of the pitches P, although spurious responses on the higher side of the resonance frequency can be kept suppressed by virtue of the weights assigned by apodization as they are attributed to transverse mode resonances as discussed above.

Figure 11A:
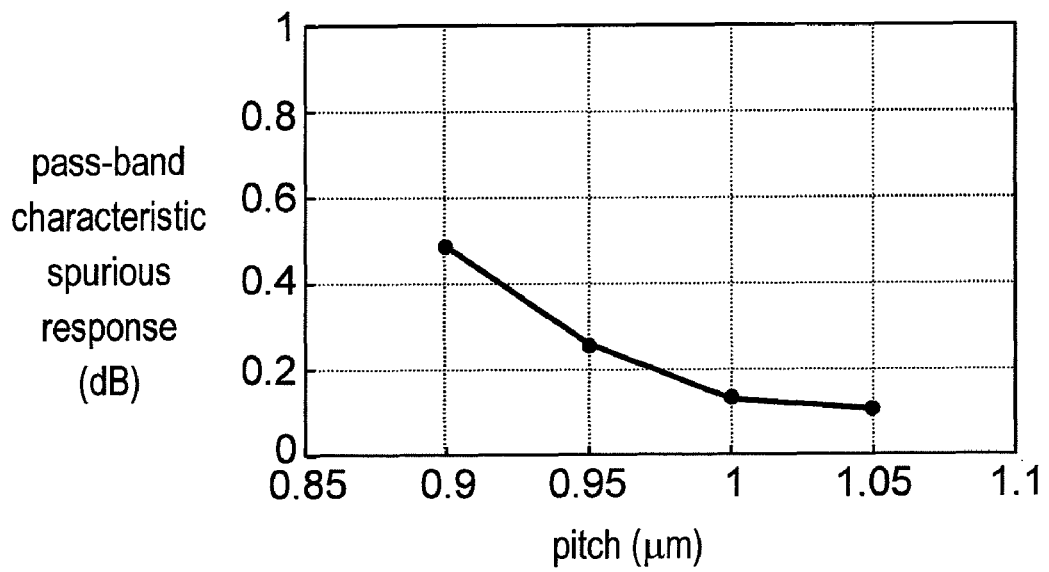
FIG. 11A is a graphic chart showing a relation between spurious responses and pitches.
Figure 11B:
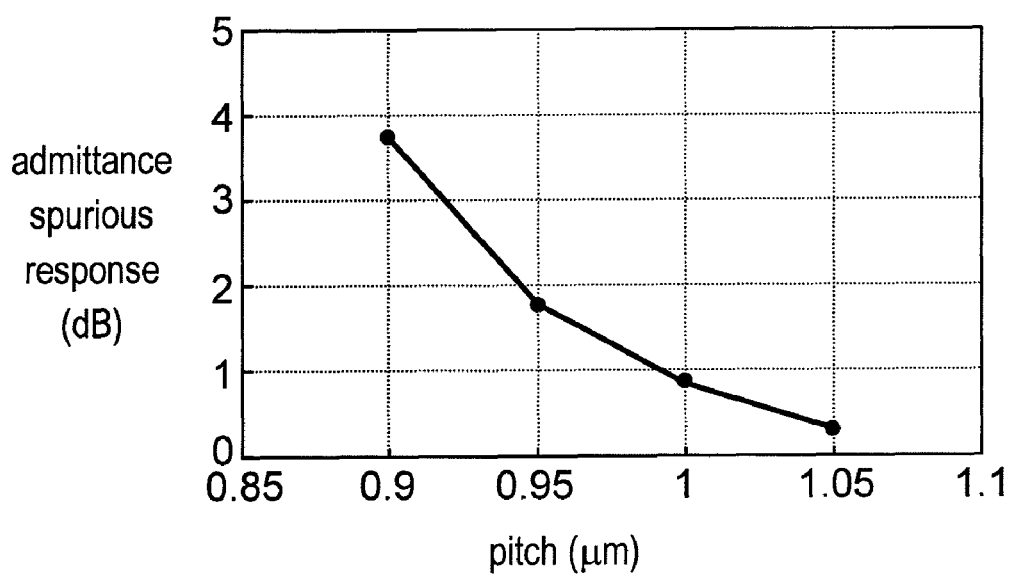
FIG. 11B is a graphic chart showing another relation between spurious responses and pitches.

FIG. 11A shows a relation between spurious response in the pass-band characteristic and pitch, and FIG. 11B shows a relation between spurious response in admittance and the pitch. As shown in these figures, the spurious response increases as the pitch P is reduced which increases the metallization ratio (η). In other words, the higher the resonance frequency of the surface acoustic wave resonator the larger the spurious response becomes.

As discussed above, it became evident that the configuration of the surface acoustic wave resonator holds three aspects of relation to the spurious responses on the lower side of the resonance frequency. The first aspect relative to the spurious response on the lower side of the resonance frequency is that it can be suppressed by way of controlling the depositing condition such as increasing the bias voltage in a manner to optimize the shape of the thin $SiO_2$ film. On the other hand, there is a potential risk that it can impair the characteristics especially at the anti-resonance point of the surface acoustic wave resonator. The second aspect is that an increase in the metallization ratio (η) of the comb electrodes raises the spurious response while it can improve the Q-factor at the anti-resonance point. The third aspect is that the spurious response increases as the pitch P of the comb electrodes is reduced, or the resonance frequency of the comb electrodes is increased.

When surface acoustic wave resonators are used to compose a ladder type filter, it is a general practice to have their resonance frequencies different between the one used in a series arm and the other in a parallel arm. To achieve a band-pass filtering characteristic, a resonance frequency of the series arm is set to be higher than that of the parallel arm. In this case, when the depositing condition of forming the thin $SiO_2$ film, or the bias voltage is set to a value suitable for the surface acoustic wave resonator in the series arm to suppress spurious response on the lower side of its resonance frequency, the bias voltage of such value comes to be excessive for the surface acoustic wave resonator in the parallel arm, thereby resulting in impairment of its characteristic.

It became clear, however, that such impairment in the characteristic of the surface acoustic wave resonator in the parallel arm can be improved to achieve a superior surface acoustic wave filter by making good use of the three aspects of the relation obtained from the above evaluations of the surface acoustic wave resonators and spurious responses.

Figure 12:
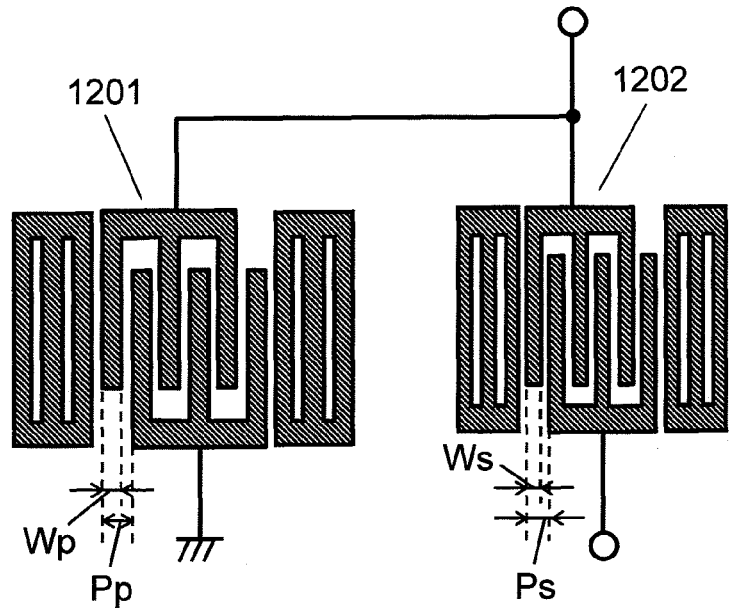
FIG. 12 is a schematic view of a surface acoustic wave filter according to one exemplary embodiment of the present invention.

FIG. 12 is a schematic view showing a surface acoustic wave filter according to this exemplary embodiment.

The surface acoustic wave filter of this exemplary embodiment shown in FIG. 12 comprises surface acoustic wave resonator 1201 in a parallel arm and surface acoustic wave resonator 1202 in a series arm formed on a piezoelectric substrate (not shown), and a thin $SiO_2$ film (not shown) covering upper surfaces of the surface acoustic wave resonators.

In FIG. 12, a metallization ratio of surface acoustic wave resonator 1201 is given by the expression ηp=Wp/Pp when pitches and electrode width of comb electrodes are denoted by Pp and Wp respectively. A metallization ratio of surface acoustic wave resonator 1202 is also given by the expression ηs=Ws/Ps when pitches and electrode width of comb electrodes are denoted by Ps and Ws respectively.

In this embodiment here, a resonance frequency of surface acoustic wave resonator 1201 in the parallel arm is set lower than that of surface acoustic wave resonator 1202 in the series arm to compose the band pass filter, and their pitches have a relation of Ps<Pp. In addition, their metallization ratios are set to have a relation of ηp>ηs.

These surface acoustic wave resonators are formed on a single piece of the piezoelectric substrate in a configuration shown in FIG. 12. In other words, spurious response is sufficiently suppressed for the surface acoustic wave resonator in the series arm having the small pitches. In addition, spurious response is also suppressed beside the improvement of Q-factor for the surface acoustic wave resonator in the parallel arm because of the large bias voltage applied during the process of forming the thin $SiO_2$ film even though it has a large metallization ratio. It is thus possible according to the present exemplary embodiment to improve the characteristic of the surface acoustic wave resonator in the parallel arm even with the configuration designed to suppress the spurious response of the surface acoustic wave resonator in the series arm.

According to this exemplary embodiment, the structure configured as above can suppress the spurious response of the surface acoustic wave resonator in the series arm having the small pitches and improve the Q-factor of the surface acoustic wave resonator in the parallel arm having the large pitches by way of increasing the metallization ratio, thereby realizing the surface acoustic wave filter having a superior filtering characteristic as a ladder type filter.

Although what has been described in this exemplary embodiment pertains to an example of band pass filter, there can be a case that the relation of resonance frequencies is reversed between the resonators of the series arm and the parallel arm when composing a notch filter, for example. When this is the case, all that is required is to set a condition of suppressing spurious response for the surface acoustic wave resonator in the parallel arm by providing the surface acoustic wave resonator in the series arm with a larger metallization ratio than that of the parallel arm, so that the metallization ratio of the surface acoustic wave resonator of a lower resonance frequency is made to be larger than that of the surface acoustic wave resonator of a higher resonance frequency.

Again, although what has been described in this exemplary embodiment is a typical structure of the surface acoustic wave filter having two surface acoustic wave resonators, each in the parallel arm and the series arm, the described embodiment shall be taken as illustrative and not restrictive in number and arrangement of the surface acoustic wave resonators. What is needed is a structure comprising a plurality of surface acoustic wave resonators that simply satisfy the relation between metallization ratios and pitches of their comb electrodes discussed in this exemplary embodiment.

Figure 13:
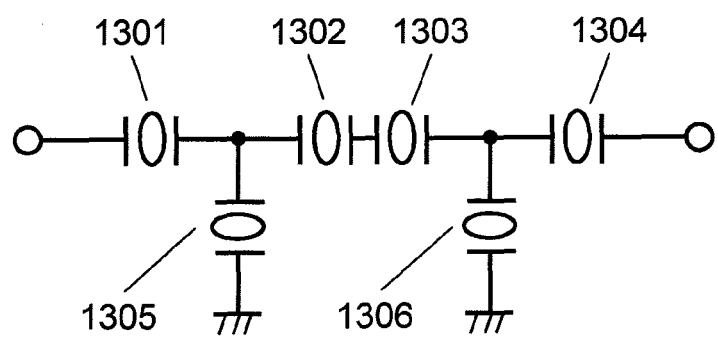
FIG. 13 is a schematic view of another surface acoustic wave filter according to the exemplary embodiment.

For example, a structure shown in FIG. 13 is also acceptable. The structure shown in FIG. 13 is a schematic view of another surface acoustic wave filter according to this exemplary embodiment.

In FIG. 13, reference marks 1301, 1302, 1303 and 1304 represent surface acoustic wave resonators in a series arm, and reference marks 1305 and 1306 represent surface acoustic wave resonators in parallel arms. These surface acoustic wave resonators comprise comb electrodes and a thin $SiO_2$ film formed on a piezoelectric substrate. Pitches and metallization ratios of surface acoustic wave resonators 1301, 1302, 1303, 1305 and 1306 are denoted herein by P1, P2, P3, P4, P5, P6 and η1, η2, η3, η4, η5, η6 respectively.

In the present invention, it becomes possible to improve characteristics of the surface acoustic wave resonators in the series arm when they are designed to have a relation of η1>η2 with their pitches in a relation of P1>P2 for example. It is also possible to improve characteristics of the surface acoustic wave resonators in the parallel arm when they are designed to have a relation of η5>η6 with their pitches in a relation of P5>P6 for example. In other words, these relations between the metallization ratios and the pitches of the present invention are applicable not only to the resonators in the parallel arm and the series arm but also to the other surface acoustic wave resonators constituting the surface acoustic wave filter to achieve the like advantages.

In addition, the relations between the metallization ratios and the pitches of the present invention are also applicable to antenna duplexers.

Figure 14:
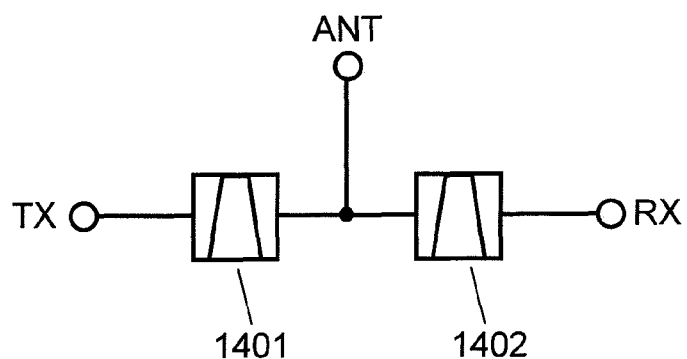
FIG. 14 is a schematic view of an antenna duplexer according to the exemplary embodiment.

Illustrated in FIG. 14 is a schematic view of an antenna duplexer according to one exemplary embodiment of the present invention.

The antenna duplexer in FIG. 14 has a structure comprising sending filter 1401 and receiving filter 1402. Sending filter 1401 and receiving filter 1402 shown here are surface acoustic wave filters formed on a piezoelectric substrate, and they have a thin $SiO_2$ film formed thereon.

The antenna duplexer of this exemplary embodiment also has the like advantages as discussed above when it is so designed that a metallization ratio of at least one of surface acoustic wave resonators incorporated in sending filter 1401 is larger than that of at least one of surface acoustic wave resonators incorporated in receiving filter 1402 in an instance that a pass band frequency of receiving filter 1402 is higher than that of sending filter 1401.

When there is an inverse relation in the frequencies between sending filter 1401 and receiving filter 1402, all that is needed is to reverse the aforesaid relation of their metallization ratios In the present exemplary embodiment, what has been illustrated are typical examples that employ rotated Y-cut substrates of $LiNbO_3$ having a cut angle of 5 degrees as the piezoelectric substrates, and the electrodes and the thin $SiO_2$ films have thicknesses of the values standardized according to the wavelength, which are 8% and 20% respectively. However, they shall not be taken as restrictive in the scope of this invention. The structure of the present invention is applicable to any rotated Y-cut $LiNbO_3$ substrates as long as the cut angle is within a range of −10 to +30 degrees to achieve surface acoustic wave filters and antenna duplexers of wide frequency band, superior temperature characteristic and pass-band characteristic.

Although the electrodes are illustrated in this exemplary embodiment as being made of a material containing aluminum as the principal component, this shall not be taken as restrictive. The electrodes may as well be made of copper or other materials.

Moreover, although the thin dielectric film used for the structure of this exemplary embodiment has been illustrated as being a film of $SiO_2$, the present invention is also practicable with other materials.

The present invention is also not restrictive with respect to the configuration of comb electrodes, such that a dummy electrode may be provided additionally, and the weighting by apodization of the comb electrodes can be made in any shape other than that illustrated in this exemplary embodiment.

Furthermore, the present invention is also applicable to a method of manufacturing any of a surface acoustic wave filter and an antenna duplexer of the type having surface acoustic wave resonators formed on a single piece of substrate.

In other words, the method of manufacturing a surface acoustic wave filter and an antenna duplexer of the present invention comprises a step of forming comb electrodes on a substrate to compose a plurality of surface acoustic wave resonators, and a step of forming a thin $SiO_2$ film in a manner to cover the comb electrodes, wherein the above steps form the surface acoustic wave resonators of a configuration that a metallization ratio of the surface acoustic wave resonator having larger pitches is larger than a metallization ratio of the surface acoustic wave resonator having smaller pitches.

The present invention is useful for various types of surface acoustic wave filters and antenna duplexers by virtue of the advantages of their superior characteristics while suppressing spurious responses.

The invention claimed is:

1. A surface acoustic wave filter comprised of a plurality of surface acoustic wave resonators having different resonance frequencies, the filter comprising:
    a substrate made of lithium niobate;
    comb electrodes formed on an upper surface of the substrate; and
    a thin dielectric film covering the comb electrodes;
    wherein a metallization ratio of the surface acoustic wave resonator having a lower resonance frequency is larger than a metallization ratio of the surface acoustic wave resonator having a higher resonance frequency; and
    wherein the plurality of surface acoustic wave resonators comprises at least two surface acoustic wave resonators in a series arm, and a metallization ratio of one of the surface acoustic wave resonators in the series arm having a lower resonance frequency is larger than a metallization ratio of the other surface acoustic wave resonator having a higher resonance frequency.

2. The surface acoustic wave filter of claim 1, wherein the plurality of surface acoustic wave resonators further comprises at least two surface acoustic wave resonators in parallel arms, and a metallization ratio of one of the surface acoustic wave resonators in the parallel arms having a lower resonance frequency is larger than a metallization ratio of the other surface acoustic wave resonator having a higher resonance frequency.

3. The surface acoustic wave filter of claim 1, wherein the substrate comprises a rotated Y-cut substrate having a cut angle set to a range of −10 to +30 degrees.

4. The surface acoustic wave filter of claim 1, wherein the thin dielectric film comprises a $SiO_2$ film.

5. The surface acoustic wave filter of claim 1, wherein the thin dielectric film is configured with raised portions.

6. The surface acoustic wave filter of claim 1, wherein the substrate is a single piece common to the plurality of surface acoustic wave resonators.

7. An antenna duplexer having a receiving filter and a sending filter, each of the receiving filter and the sending filter being comprised of a surface acoustic wave filter provided with a plurality of surface acoustic wave resonators having different resonance frequencies, wherein each of the resonators comprises a substrate made of lithium niobate, a comb electrode formed on an upper surface of the substrate and a thin dielectric film covering the comb electrode, and further wherein a metallization ratio of the surface acoustic wave resonator having a lower resonance frequency is larger than a metallization ratio of the surface acoustic wave resonator having a higher resonance frequency, wherein a pass band of the receiving filter is set higher than a pass band of the sending filter, and a metallization ratio of at least one of the surface acoustic wave resonators constituting the sending filter is larger than a metallization ratio of at least one of the surface acoustic wave resonators constituting the receiving filter.

* * * * *